(12) United States Patent
Atanackovic

(10) Patent No.: US 7,655,327 B2
(45) Date of Patent: Feb. 2, 2010

(54) COMPOSITION COMPRISING RARE-EARTH DIELECTRIC

(75) Inventor: Petar Atanackovic, Palo Alto, CA (US)

(73) Assignee: Translucent, Inc., Palo Alto, CA (US)

( * ) Notice: Subject to any disclaimer, the term of this patent is extended or adjusted under 35 U.S.C. 154(b) by 783 days.

(21) Appl. No.: 11/253,525

(22) Filed: Oct. 19, 2005

(65) Prior Publication Data

US 2006/0060826 A1    Mar. 23, 2006

Related U.S. Application Data

(63) Continuation-in-part of application No. 11/025,693, filed on Dec. 28, 2004.

(60) Provisional application No. 60/533,378, filed on Dec. 29, 2003.

(51) Int. Cl.
*B32B 9/00* (2006.01)
*B32B 19/00* (2006.01)

(52) U.S. Cl. .................. 428/701; 428/699; 428/700

(58) Field of Classification Search ............ 428/698, 428/699, 700, 701
See application file for complete search history.

(56) References Cited

U.S. PATENT DOCUMENTS

| | | | |
|---|---|---|---|
| 4,195,908 A | | 4/1980 | Kestigian et al. |
| 4,842,960 A | | 6/1989 | Lindmayer |
| 4,891,507 A | | 1/1990 | Lindmayer |
| 4,966,675 A | * | 10/1990 | Steininger ............ 204/290.07 |
| 5,012,098 A | | 4/1991 | Lindmayer |
| 5,919,515 A | * | 7/1999 | Yano et al. ............ 427/126.3 |
| 6,201,265 B1 | * | 3/2001 | Teraguchi ............ 257/99 |
| 6,469,357 B1 | * | 10/2002 | Hong et al. ............ 257/410 |
| 6,501,121 B1 | | 12/2002 | Yu et al. |
| 6,518,634 B1 | | 2/2003 | Kaushik et al. |
| 6,528,377 B1 | | 3/2003 | Mihopoulos et al. |
| 6,534,348 B1 | | 3/2003 | Moise et al. |
| 6,541,788 B2 | | 4/2003 | Petroff et al. |
| 6,610,548 B1 | | 8/2003 | Ami et al. |
| 6,638,872 B1 | | 10/2003 | Croswell et al. |
| 6,709,989 B2 | | 3/2004 | Ramdani et al. |
| 6,734,453 B2 | | 5/2004 | Atanackovic et al. |
| 6,858,864 B2 | | 2/2005 | Atanackovic et al. |
| 6,943,385 B2 | | 9/2005 | Usuda et al. |
| 7,008,559 B2 | | 3/2006 | Chen |
| 7,018,484 B1 | | 3/2006 | Atanackovic |

(Continued)

FOREIGN PATENT DOCUMENTS

WO    WO 02/13275    2/2002

OTHER PUBLICATIONS

U.S. Appl. No. 11/788,153, filed Apr. 18, 2007, Atanackovic, Petar B.

(Continued)

*Primary Examiner*—Timothy M Speer
*Assistant Examiner*—Jonathan C Langman
(74) *Attorney, Agent, or Firm*—Fernandez & Associates, LLP

(57) ABSTRACT

Compositions comprising a single-phase rare-earth dielectric disposed on a substrate. Embodiments of the present invention provide the basis for high-K gate dielectrics in conventional integrated circuits and high-K buried dielectrics as part of a semiconductor-on-insulator wafer structure.

2 Claims, 6 Drawing Sheets

U.S. PATENT DOCUMENTS

| | | |
|---|---|---|
| 7,023,011 B2 | 4/2006 | Atanackovic et al. |
| 7,037,806 B1 | 5/2006 | Atanackovic |
| 7,129,551 B2 | 10/2006 | Osten |
| 7,135,699 B1 | 11/2006 | Atanackovic |
| 7,199,015 B2 | 4/2007 | Atanackovic |
| 7,199,451 B2 | 4/2007 | Kelman |
| 7,211,821 B2 | 5/2007 | Atanackovic |
| 7,217,636 B1 | 5/2007 | Atanackovic |
| 7,253,080 B1 | 8/2007 | Atanackovic |
| 7,273,657 B2 | 9/2007 | Atanackovic |
| 7,351,993 B2 | 4/2008 | Atanackovic |
| 7,384,481 B2 | 6/2008 | Atanackovic |
| 7,416,959 B2 | 8/2008 | Atanackovic |
| 7,501,627 B1 | 3/2009 | Herr |
| 2002/0149011 A1* | 10/2002 | Gutsche et al. ............... 257/43 |
| 2005/0161773 A1 | 7/2005 | Atanackovic |
| 2005/0163692 A1 | 7/2005 | Atanackovic |
| 2006/0060826 A1 | 3/2006 | Atanackovic |
| 2006/0065930 A1 | 3/2006 | Kelman |
| 2008/0217695 A1 | 9/2008 | Atanackovic |
| 2008/0241519 A1 | 10/2008 | Schroeder |
| 2008/0286949 A1 | 11/2008 | Atanackovic |
| 2008/0308143 A1 | 12/2008 | Atanackovic |
| 2009/0001329 A1 | 1/2009 | Atanackovic |

OTHER PUBLICATIONS

U.S. Appl. No. 11/828,964, filed Jul. 26, 2007, Atanackovic, Petar B.
U.S. Appl. No. 11/858,838, filed Sep. 20, 2007, Atanackovic, Petar B.
U.S. Appl. No. 11/873,387, filed Oct. 16, 2007, Atanackovic, Petar B.
U.S. Appl. No. 12/171,200, filed Jul. 10, 2008, Atanackovic, Petar B.
U.S. Appl. No. 12/408,297, filed Mar. 20, 2009, Clark, Andrew.

* cited by examiner

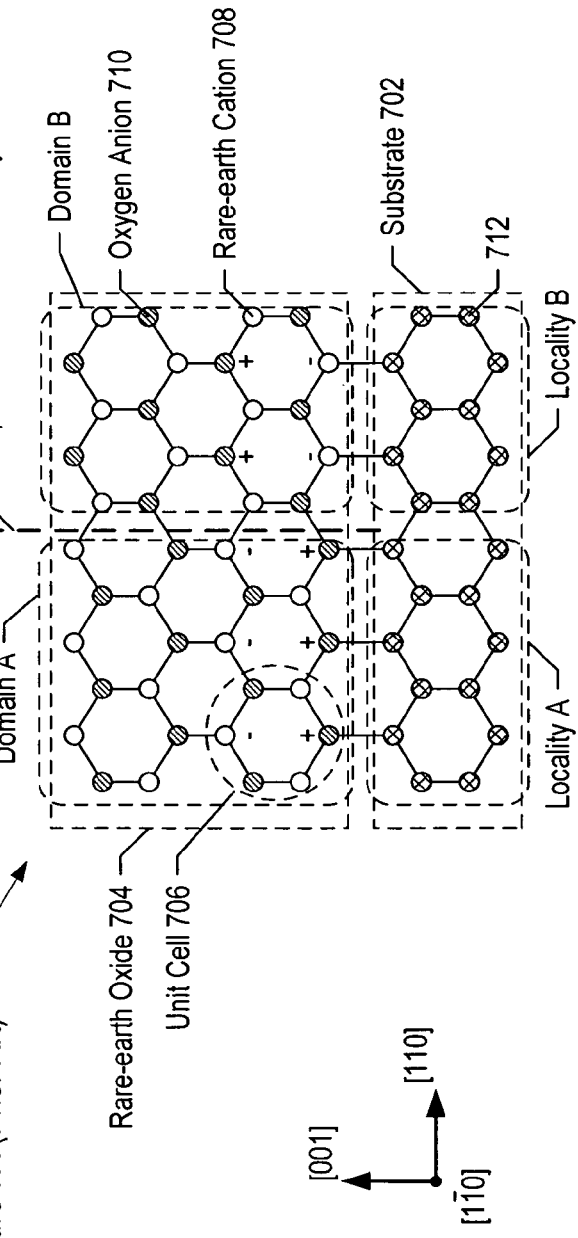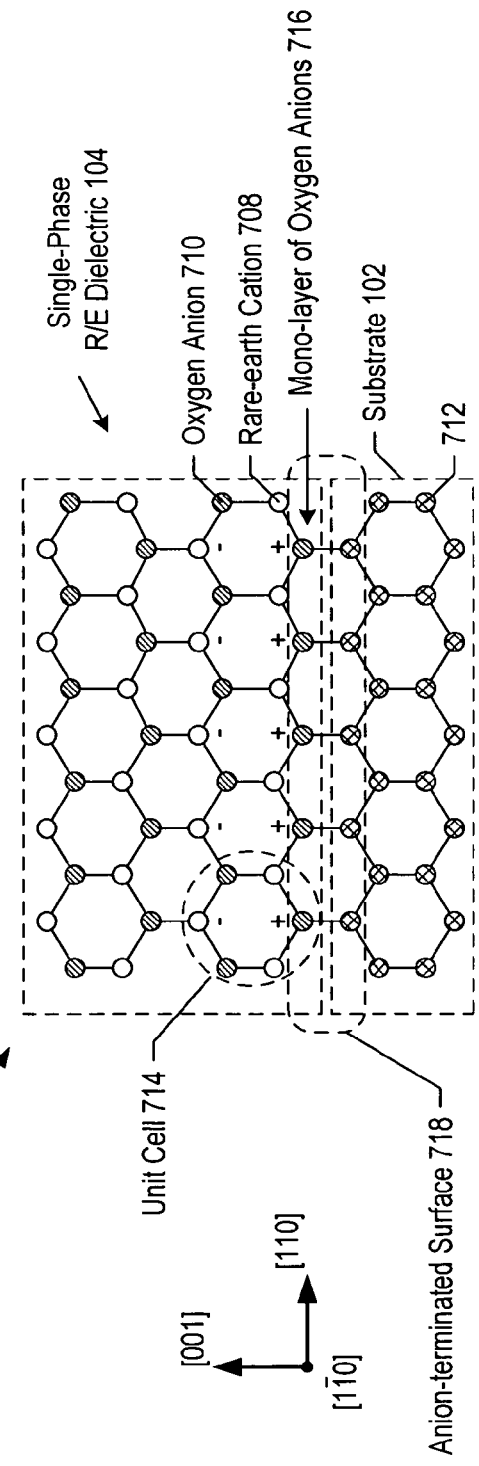
Figure 7A (Prior Art)
Figure 7B

COMPOSITION COMPRISING RARE-EARTH DIELECTRIC

STATEMENT OF RELATED CASES

This application is a continuation-in-part of co-pending U.S. patent application Ser. No. 11/025,693 filed on Dec. 28, 2004, which claims priority of provisional patent application U.S. Ser. No. 60/533,378 filed on Dec. 29, 2003. Furthermore, this case is related to U.S. patent application, filed on even date herewith, and incorporated by reference herein.

FIELD OF THE INVENTION

The present invention relates to compositions for electronic devices and integrated circuits.

BACKGROUND OF THE INVENTION

Silicon is the material of choice for the fabrication of ultra large scale integrated ("ULSI") circuits. This is due, in large part, to the fact that silicon is the only semiconductor substrate material that can be formed as large-diameter wafers with sufficiently low defect density. Silicon also forms a high-quality oxide (i.e., silicon dioxide), and the quality of the silicon/silicon dioxide interface is also quite high.

It is notable that germanium, while otherwise very desirable as a material for the fabrication of integrated circuits, has not achieved commercial acceptance. This is due to its high cost and low availability, which is a direct consequence of the defect-related low-yield of germanium substrates. This high-defect density results from difficulties with producing bulk germanium substrates.

But the baton might soon be passed from the silicon/silicon dioxide material system to other materials in order to satisfy industry requirements for continued advancements in the performance of integrated circuits and the removal of roadblocks to the continuation of Moore's Law.

More specifically, as node-scaling of ULSI circuits is pushed further into the sub-micron regime, silicon dioxide becomes increasingly less attractive as an interlayer dielectric material (e.g., gate oxide, etc.). In particular, as silicon-based interlayer dielectrics become extremely thin, fundamental problems arise, such as an increase in quantum mechanical tunneling current, a decrease in dielectric breakdown strength, and a decrease in reliability. Furthermore, decreases in the thickness of silicon-based interlayer dielectrics in ULSI electronics will result in increases in capacitance, which cause concomitant increases in RC (interconnect) delays and cross talk. This adversely impacts device speed and power dissipation.

A further issue with the silicon/silicon dioxide material system is that in conventional integrated-circuit processing, a rate-limiting and yield-limiting step is the production of a gate oxide of sufficient quality. In order to produce a high-quality gate oxide, the semiconductor surface is subjected to high temperatures while under vacuum to desorb any native oxide that has formed during prior wafer processing. Once this native oxide is desorbed, a new gate oxide is formed on the newly-cleared surface. As ULSI technology continues to scale further into the sub-micron regime, it will become increasingly difficult and expensive to obtain the gate oxides required.

In order to address these problems, the semiconductor industry has undertaken a search for alternative materials for use as an interlayer dielectric. Suitable alternative materials should exhibit:

i. a dielectric constant (K) higher than that of silicon dioxide;
ii. large conduction and valence band offsets with silicon;
iii. thermal stability and reliability;
iv. high-quality dielectric/semiconductor interface;
v. low impurity concentration; and
vi. manufacturability.

Single-crystal rare-earth dielectrics are an attractive choice for high-K dielectric materials. Unfortunately, these materials do not naturally occur, nor can they be produced using prior-art growth techniques. On the other hand, amorphous, poly-crystalline, or multi-domain crystalline rare-earth oxides are possible to produce. But these rare-earth oxides are ill-suited for high-performance integrated circuits since they do not exhibit some of the characteristics listed above. In addition, the thickness to which many prior-art rare-earth dielectrics can be grown on silicon is limited.

Rare-earth dielectrics deposited using prior art techniques have not realized single domain, single crystal stoichiometry that enables high performance integrated circuit devices. The inherent limitation of most prior art techniques is a lack of elemental control during deposition. These rare-earth dielectric deposition techniques typically involve the evaporation of constituent rare-earth oxide powders to deposit evaporant on the substrate. Due to the very high melting point of these oxides, coupled with a very low vapor pressure, e-beam evaporation has been the most commonly used technique in the prior art.

Rare-earth dielectrics comprising alkaline-oxide layers are characterized by a negligible conduction band offset relative to silicon. In addition, alkaline-oxide layers on silicon are limited in thickness to approximately 10 monolayers, due to crystal relaxation and defect formation. These alkaline-oxide films, therefore, provide insufficient utility as interlayer dielectric layers in high-performance silicon integrated circuits.

Continued scaling of ULSI into the sub-micron regime is also pushing the limits of the silicon substrate itself. It is widely expected that the future of ULSI will be based on semiconductor-on-insulator wafers that utilize fully-depleted field-effect transistors (FETs) formed in an ultrathin, active layer of silicon. Fully-depleted electronic devices become viable as the thickness of the active layer is reduced below 100 nanometers (nm).

Currently available methods to produce silicon-on-insulator ("SOI") wafers rely on wafer bonding of oxidized silicon wafers followed by removal of most of one substrate the two substrates to form the active layer. Although several variations of this technology exist, all are incapable of providing ultrathin active layers of sufficient quality for fully-depleted electronics. In addition, the interface quality and impurity concentration of the buried oxide layers is insufficient to support high-performance integrated circuitry. Finally, the complexity of wafer bonding processes used to produce SOI wafers is quite high, which leads to high costs. For these reasons, among any others, the acceptance of SOI wafers by the semiconductor industry has been rather limited.

SUMMARY OF THE INVENTION

The present invention provides compositions having a single-phase rare-earth dielectric disposed on a substrate. As described in detail later in this specification, single-phase morphology is characterized by a single-crystal, single-domain crystalline structure. The dielectric is deposited via an epitaxy process.

In some embodiments, the basic dielectric-on-substrate composition forms the basis for a semiconductor-on-insulator layer structure that incorporates a single-phase semiconductor layer. The semiconductor layer is grown on the rare-earth dielectric via an epitaxy process. This structure is analogous to an SOI wafer in the prior art; wherein the rare-earth dielectric serves as the buried oxide layer and the semiconductor layer is the upper, active layer of silicon.

In some further embodiments, one or more additional layers of dielectric material and/or semiconductor material are added to the semiconductor-on-insulator structure disclosed herein. For example, in some of these embodiments, an additional layer of single-phase rare-earth dielectric is grown on the semiconductor layer. This additional layer can serve as a gate dielectric for a transistor.

In some other embodiments, the additional layers of dielectric and semiconductor are periodically arranged. These various compositions can be used, for example, in the formation of double-gate structures and other complex semiconductor-based devices and high-performance integrated circuits.

A distinguishing feature of the compositions disclosed herein is the morphology of the rare-earth dielectric(s) and, in some cases, the morphology of the semiconductor(s). In particular, these compositions will include at least one layer of a rare-earth dielectric that exhibits single-phase morphology. Some compositions include a semiconductor that also exhibits single-phase morphology, which, in fact, is enabled by the presence of the single-phase rare-earth dielectric.

The presence of single-phase materials in the compositions disclosed herein results in high-quality dielectric/semiconductor interfaces, such as are required for high-performance devices and circuits. Furthermore, rare-earth dielectric layers that exhibit single-phase morphology, as disclosed herein, do not suffer from a limitation on thickness, as exhibited in the prior art.

BRIEF DESCRIPTION OF THE DRAWINGS

FIG. 7A depicts a crystal structure diagram of a composition comprising a rare-earth oxide disposed on a substrate, in accordance with the prior art.

FIG. 7B depicts a crystal structure diagram of the composition of FIG. 1.

DETAILED DESCRIPTION

Figure 2:
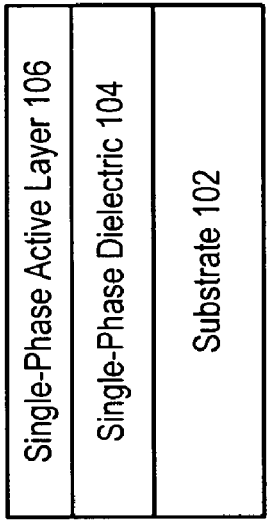
FIG. 2 depicts a variation of the illustrative embodiment, wherein the composition of FIG. 1 is used to form a semiconductor-on-insulator arrangement.

For clarity and ease of understanding, this Detailed Description is organized into several sections. A brief introduction to the disclosure that follows is provided by way of the following outline.

I. Definitions
  This section provides explicit definitions for certain terms and phrases used in this Specification, including the appended claims.
II. Overview
  This section highlights the importance of "single-phase" morphology as it relates to embodiments of the present invention.
III. Compositions including a Single-Phase Rare-Earth Dielectric on a Substrate
  This section discloses the basic structure of compositions in accordance with the invention.
IV. Crystal Structure of Rare-Earth Dielectrics
  This section describes the crystal structure of rare-earth dielectrics in general, and, more particularly, the crystal structure that is desired for rare-earth dielectrics that are suitable for use in conjunction with the present invention.
V. Considerations for Producing a Single-Phase Rare-Earth Dielectric
  This section addresses important considerations in selecting and growing rare-earth dielectrics that are suitable for use in conjunction with the present invention.
  A. Cation-radius Dependency of Rear-Earth Dielectrics
    Rare-earth cations having radii larger than 0.93 angstroms are unsuitable for use in conjunction with the present invention. Suitable rear-earth cations are disclosed.
  B. Avoidance of Multi-Domain Growth of Rare-Earth Dielectrics
    Rare-earth dielectrics are typically polar. Growing polar rear-earth dielectrics on a non-polar substrate (such as silicon or germanium) usually results in multi-domain growth, which is unacceptable for use in conjunction with the present invention. As described herein, specific techniques are employed to ensure single-domain growth.
    1. Surfaces suitable for Growing Single-Phase Rare-Earth Dielectrics In order to form single-phase rare-earth dielectrics on a non-polar substrate, such as a silicon wafer, the substrate surface must provide energetically-favorable bonding sites. Several methods have been found to provide a substrate surface that enables epitaxial growth of rare-earth dielectrics having a suitable morphology. Compositions that are produced via these methods are disclosed.

VI. Active-Layer Epitaxy on Rear-Earth Dielectrics

In order to form a semiconductor-on-insulator structure that is suitable for high-performance FET devices, the "active" layer should have a single-phase crystal structure. The optimal deposition surface for producing a single-phase active layer (e.g., silicon or germanium) via epitaxy is non-polar, since silicon and germanium are non-polar crystals. But most rare-earth dielectrics typically comprise polar crystals.

Several methods have been found to provide a rare-earth dielectric surface that enables epitaxial growth of single-phase non-polar semiconductors, such as silicon and germanium. Compositions that are formed using these methods are disclosed

I. DEFINITIONS

The following terms are defined for use in this Specification, including the appended claims:

Layer means a substantially-uniform thickness of a material covering a surface. A layer can be either continuous or discontinuous (i.e., having gaps between regions of the material). For example, a layer can completely cover a surface, or be segmented into discrete regions, which collectively define the layer (i.e., regions formed using selective-area epitaxy).

Monolithically-integrated means formed on the surface of the substrate, typically by depositing layers disposed on the surface.

Disposed on means "exists on" an underlying material or layer. This layer may comprise intermediate layers, such as transitional layers, necessary to ensure a suitable surface. For example, if a material is described to be "disposed on a substrate," this can mean either (1) the material is in intimate contact with the substrate; or (2) the material is in contact with one or more transitional layers that reside on the substrate.

Single-crystal means a crystalline structure that comprises substantially only one type of unit-cell. A single-crystal layer, however, may exhibit some crystalline defects such as stacking faults, dislocations, or other commonly occurring crystalline defects.

Single-domain means a crystalline structure that comprises substantially only one structure of unit-cell and substantially only one orientation of that unit cell. In other words, a single-domain crystal exhibits no twinning or anti-phase domains.

Single-phase means a crystalline structure that is both single-crystal and single-domain.

Substrate means the material on which deposited layers are formed. Exemplary substrates include, without limitation: bulk silicon wafers, in which a wafer comprises a homogeneous thickness of single-crystal silicon; composite wafers, such as a silicon-on-insulator wafer that comprises a layer of silicon that is disposed on a layer of silicon dioxide that is disposed on a bulk silicon handle wafer; or any other material that serves as base layer upon which, or in which, devices are formed. Examples of such other materials that are suitable, as a function of the application, for use as substrate layers and bulk substrates include, without limitation, germanium, alumina, gallium-arsenide, indium-phosphide, silica, silicon dioxide, borosilicate glass, pyrex, and sapphire.

Miscut Substrate means a substrate which comprises a surface crystal structure that is oriented at an angle to that associated with the crystal structure of the substrate. For example, a 6° miscut <100> silicon wafer comprises a <100> silicon wafer that has been cut at an angle to the <100> crystal orientation by 6° toward another major crystalline orientation, such as <110>. Typically, but not necessarily, the miscut will be up to about 20 degrees. Unless specifically noted, the phrase "miscut substrate" includes miscut wafers having any major crystal orientation. That is, a <111> wafer miscut toward the <011> direction, a <100> wafer miscut toward the <110> direction, and a <011> wafer miscut toward the <001> direction.

Semiconductor-on-Insulator means a composition that comprises a single-crystal semiconductor layer, a single-phase dielectric layer, and a substrate, wherein the dielectric layer is interposed between the semiconductor layer and the substrate. This structure is reminiscent of prior-art silicon-on-insulator ("SOI") compositions, which typically include a single-crystal silicon substrate, a non-single-phase dielectric layer (e.g., amorphous silicon dioxide, etc.) and a single-crystal silicon semiconductor layer. Several important distinctions betweens prior-art SOI wafers and the inventive semiconductor-on-insulator compositions are that:

Semiconductor-on-insulator compositions include a dielectric layer that has a single-phase morphology, whereas SOI wafers do not. In fact, the insulator layer of typical SOI wafers is not even single crystal.

Semiconductor-on-insulator compositions include a silicon, germanium, or silicon-germanium "active" layer, whereas prior-art SOI wafers use a silicon active layer. In other words, exemplary semiconductor-on-insulator compositions in accordance with the invention include, without limitation: silicon-on-insulator, germanium-on-insulator, and silicon-germanium-on-insulator.

In some embodiments, the semiconductor-on-insulator compositions that are disclosed herein include additional layers between the semiconductor layer and the substrate.

II. OVERVIEW

The present invention provides compositions having a single-phase (i.e., single crystal and single domain) rare-earth dielectric disposed on a substrate. In some embodiments, this basic dielectric-on-substrate composition forms the basis for a semiconductor-on-insulator structure that adds a single-phase semiconductor layer on the rare-earth dielectric. In some further embodiments, the semiconductor-on-insulator arrangement forms the basis for compositions that include additional layers. Among other uses, the compositions disclosed herein are useful for forming high-performance integrated circuits. It is notable that the compositions described herein include layers having a unique, single-phase morphology. In fact, these layers could not have been made using existing techniques, as they have been practiced in the prior art.

III. COMPOSITIONS COMPRISING A SINGLE-PHASE RARE-EARTH DIELECTRIC ON A SUBSTRATE

Figure 4:
FIG. 4 depicts a variation of the illustrative embodiment, wherein a composition includes a periodic arrangement of a single-phase active layer on a single-phase dielectric layer, repeated as desired.
Figure 1:
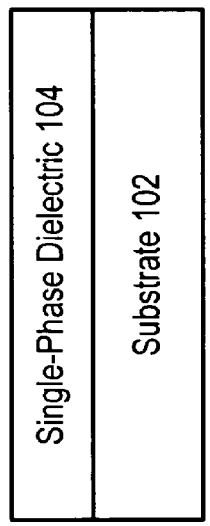
FIG. 1 depicts a composition that includes a single-phase rare-earth dielectric on a substrate, in accordance with the illustrative embodiment of the present invention.
Figure 3:
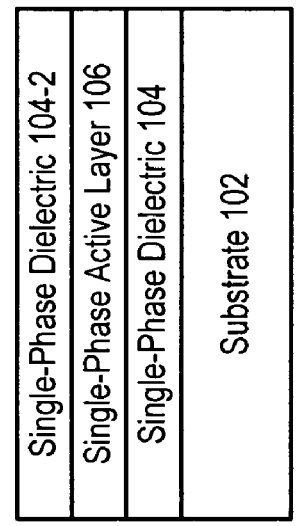
FIG. 3 depicts a variation of the illustrative embodiment, wherein an additional single-phase rare-earth dielectric is disposed on the semiconductor-on-insulator arrangement of FIG. 2.

FIG. 1 depicts composition 100A in accordance with the illustrative embodiment of the present invention. FIGS. 2-4 depict several alternative embodiments, which incorporate and expand on composition 100A.

Composition 100A comprises substrate 102 and single-phase rare-earth dielectric 104. Composition 100B, which is depicted in FIG. 2, is a semiconductor-on-insulator structure that includes composition 100A (i.e., substrate 102 and single-phase rare-earth dielectric 104) as well as single-phase active layer 106.

In some embodiments, substrate 102 is a standard silicon wafer having a <100> crystal orientation, as is well-known to those skilled in the art. In some alternative embodiments, substrate 102 is a wafer other than <100> silicon. Other suitable substrate materials include, without limitation, <111> silicon, <011> silicon, miscut <100> silicon, miscut <111> silicon, miscut <011> silicon, germanium, and miscut germanium.

Single-phase rare-earth dielectric 104 (hereinafter, dielectric 104) is epitaxially-grown on and monolithically-integrated with substrate 102. Among any other purposes, dielectric 104 provides a high-K dielectric layer that electrically isolates active layer 106 from substrate 102. In some embodiments, dielectric 104 comprises erbium oxide. Additional materials suitable for use as dielectric 104 include, without limitation:

Other rare-earth oxides, such as oxides of ytterbium, dysprosium, holmium, thulium, and lutetium;

Rare-earth nitrides, such as nitrides of erbium, ytterbium, dysprosium, holmium, thulium, and lutetium;

Rare-earth phosphides, such as phosphides of erbium, ytterbium, dysprosium, holmium, thulium, and lutetium;

Typically, the thickness of dielectric layer 104 is in the range of 0.5 to 5000 nanometers. In some embodiments, the thickness of dielectric layer 104 is preferably in the range of 1 to 10 nanometers.

Single-phase active layer 106 is epitaxially-grown on and monolithically-integrated with dielectric layer 104. Active layer 106 is a layer of single-phase semiconductor suitable for formation of high-performance integrated circuits. Exemplary semiconductors suitable for use as active layer 106 include silicon, silicon carbide, germanium, and silicon-germanium. In some additional embodiments, active layer 106 is a compound semiconductor, such as gallium arsenide, indium phosphide, and alloys of gallium arsenide and indium phosphide.

In the illustrative embodiment, active layer 106 has a thickness of 50 nm; in some alternative embodiments, active layer 106 has a thickness other than 50 nm.

Turning now to FIG. 3, composition 100C includes composition 100B as well as an additional layer 104-2 of single-phase dielectric.

This additional layer of dielectric 104-2 comprises single-phase material that is epitaxially-grown on and monolithically-integrated with active layer 106. Among any other purposes, dielectric 104-2 is useful as an interlayer dielectric, gate dielectric, or other feature of high-performance integrated circuits.

Dielectric 104-2 comprises any of the materials listed above for dielectric layer 104. In some embodiments, layer 104-2 and layer 104 comprise the same material, while in some other embodiments, they are different materials. In some embodiments, layer 104-2 has a thickness of 50 nm; but in some alternative embodiments, it has a thickness other than 50 nm.

In some alternative embodiments, a composition having a periodic arrangement of layers is formed. One such composition, composition 100D, is depicted in FIG. 4. As shown in FIG. 4, the periodic arrangement includes alternating layers of dielectric and active material (e.g., 104/106/104-2/106-2 . . .). This periodic arrangement can be continued as desired, to create any of a variety of devices of varying complexity, including multiple-quantum-well structures, super lattices, double-gate structures, and the like. Those skilled in the art, in view of the present disclosure, will know how to design, make and use such structures.

As described later in this specification (see, e.g., Section V.B.1) and depicted in FIGS. 8A through 8D, in some embodiments, one or more transitional layers are present beneath dielectric 104. These layers enable the growth of single-phase rare-earth dielectric material. In compositions 100A through 100D, these layers, to the extent that they are present, are included in substrate 102.

Figure 9A:
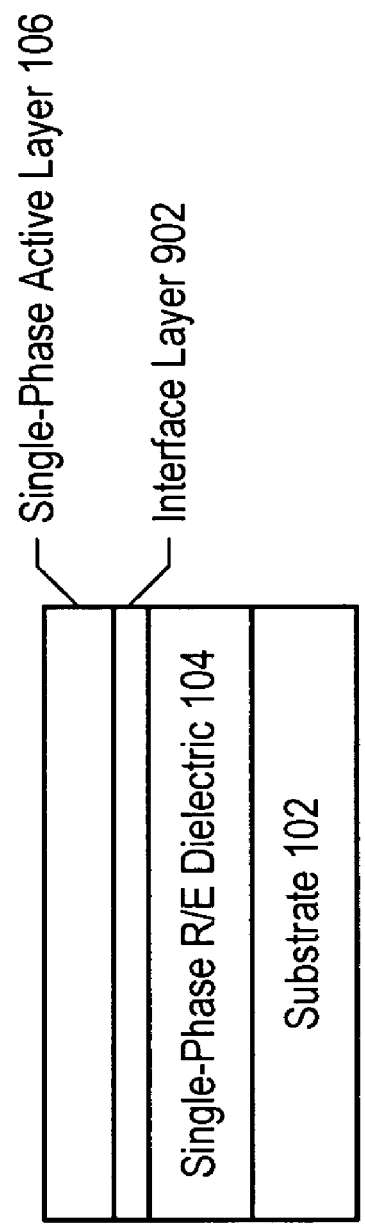
FIG. 9A depicts a layer structure comprising an interface layer that provides a suitable surface for epitaxial growth of a non-polar semiconductor on a rare-earth dielectric, according to the illustrative embodiment of the present invention.
Figure 9B:
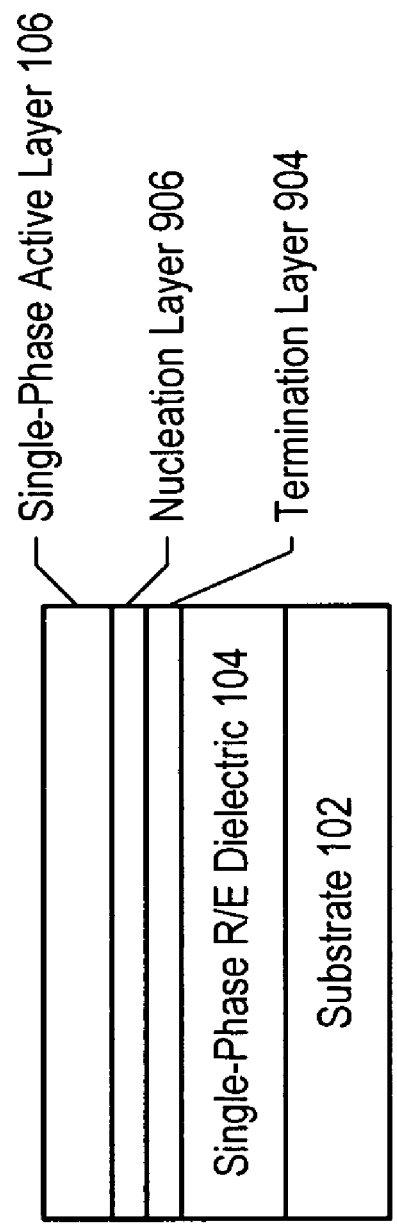
FIG. 9B depicts a layer structure comprising an interface that provides a suitable surface for epitaxial growth of a non-polar semiconductor on a rare-earth dielectric, according to an alternative embodiment of the present invention.

Similarly, as depicted in FIGS. 9A and 9B, in some embodiments, one or more transitional layers are present beneath active layer 106. These layers enable the growth of single-phase active layer material. In compositions 100B through 100D, these layers, to the extent they are present, are not shown.

IV. CRYSTAL STRUCTURE OF RARE-EARTH DIELECTRICS

As compared to other high-K dielectric films, single-phase rare-earth dielectric layers provide several key advantages regarding their use in integrated circuit devices. Specifically, these films enable:

(i) thicker gate layers and buried dielectric layers;

(ii) semiconductor-on-insulator structures with buried dielectric and active layers that do not exhibit a growth-thickness limitation;

(iii) low thermionic emission of electrons across the dielectric/semiconductor interface;

(iv) semiconductor/dielectric interfaces that exhibit a quality and defect density which rivals or surpasses that of silicon dioxide on silicon; and (v) fabrication of semiconductor-on-insulator structures that comprise a single-crystal semiconductor layer with a thickness of 100 nanometers or less.

Dielectric films that incorporate rare-earth metals are potentially a means for providing high-K dielectric films. The term "potentially" is used because there are several important caveats to the use of rare-earth metals. Specifically, the crystal structure of rare-earth dielectrics can vary significantly, and the crystal structure, in part, makes many of these rare earth dielectrics inappropriate for use in high-performance integrated circuits. Furthermore, the crystal structure of a rare-earth dielectric can affect the quality of epitaxially-grown films that are deposited on top of the rare-earth dielectric. For example, buried dielectric 104 must have high interface quality and a single-phase morphology to enable the formation of fully-depleted electrical devices in active layer 106. Rare-earth dielectrics deposited using methods that are known in the prior art are ill-suited to the formation of fully-depleted SOI devices.

Rare-earth oxides are known to exhibit fluorite-type structures. These structures exhibit morphology differences as a function of the atomic weight of the rare-earth cation present in the oxide, among any other factors.

In particular, oxides comprising lighter rare-earths form cubic $CaF_2$-type crystal structure as a result of possible ionization states of +2 and/or +3 and/or +4. Oxides having this crystal structure exhibit significant net charge defect due to a multiplicity of possible oxidation states (for rare-earth oxides). This renders these rare-earth oxides inapplicable to high-performance field-effect-transistor (FET) devices. These oxides are not suitable for use in conjunction with the various embodiments of the present invention.

The layer thickness of rare-earth dielectrics is limited when grown via prior-art methods. In general, this limitation arises from lattice mismatch, internal strain, and/or electronic or structural instability of the crystal structure of the rare-earth oxides. Annealing rare-earth oxides that are formed via prior-art methods in order to reduce strain results in mixed crystal phases (i.e., polycrystalline or amorphous). Layer thickness far exceeding that achieved in the prior art can be attained for rare-earth dielectrics as disclosed herein.

On the other hand, oxides formed from heavier rare-earths (e.g., $RE_2O_3$, etc.), exhibit a distorted $CaF_2$-type crystal structure which includes anion vacancies due to an ionization state of $RE^{3+}$. The crystal structure associated with rare-earth oxides of heavier rare earths is also known as "Bixbyite." These oxides are desirable for use as dielectric layer 104 in the compositions described herein.

Figure 5:
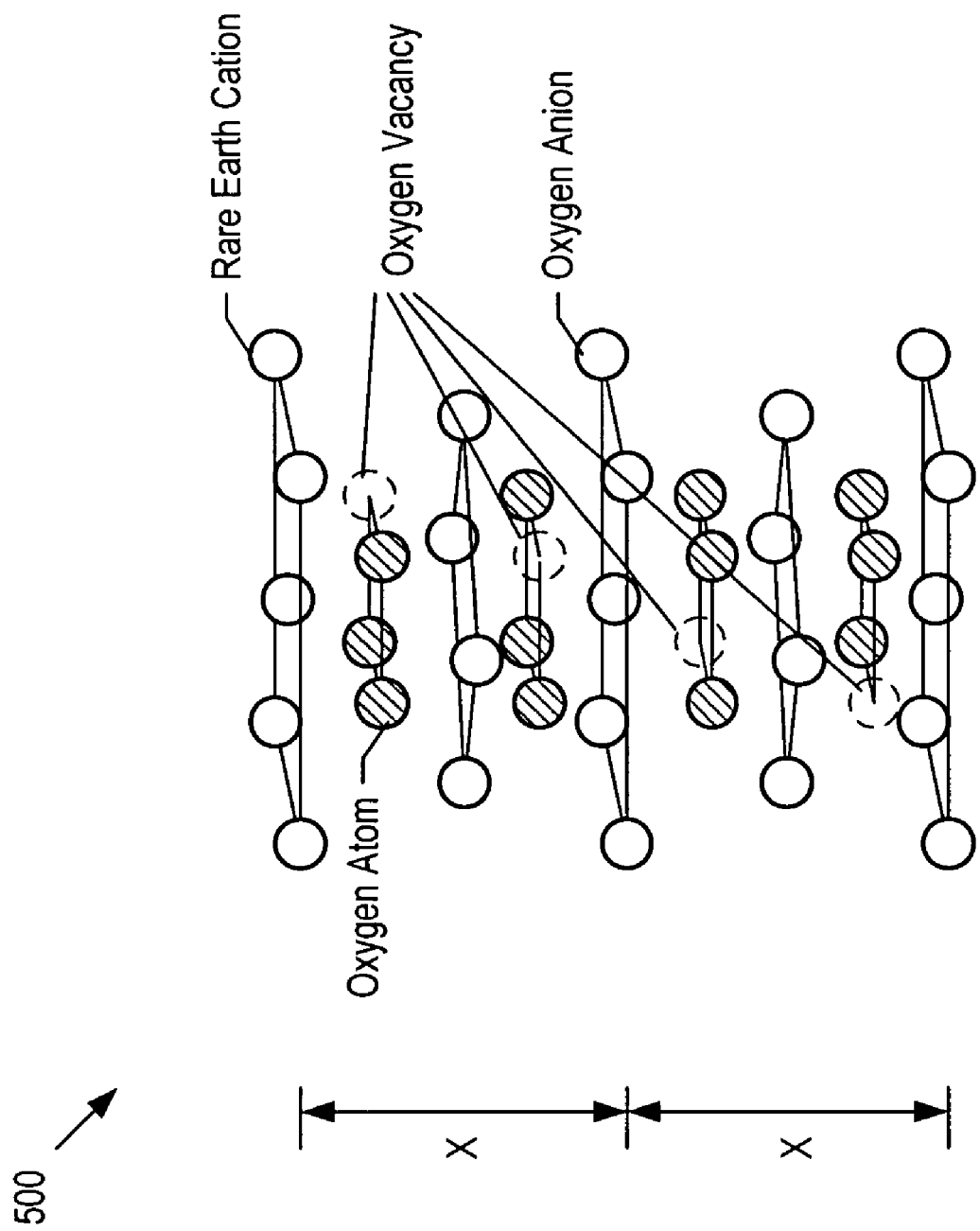
FIG. 5 depicts a crystal structure diagram of an oxygen-vacancy-derived fluorite derivative, according to the illustrative embodiment of the present invention.

FIG. 5 depicts the crystal structure diagram of unit cell 500 of a rare-earth oxide having the formula $RE_2O_3$, which in the illustrative embodiment is $Er^{+3}_2O_3$. The crystal structure of unit cell 500 is an oxygen-vacancy-derived fluorite derivative (i.e., Bixbyite structure). Dielectric layers 104, 104-2, etc., (see, e.g., compositions 100A-100D) comprise an assemblage of these unit cells.

The number and position of the anion vacancies determines the crystal shape of the $RE_2O_3$ unit cell. The crystal shape of this cell can be engineered to provide a suitable match to the lattice constant of the underlying semiconductor substrate. Oxygen vacancies along the body diagonal and/or the face diagonal lead to a C-type cubic structure as will be discussed below and with reference to FIG. 6. For example, two anion vacancies per fluorite unit cell causes the unit cell of $Er^{3+}_2O_3$ to increase to nearly twice the unit cell size of Si. This, in turn, enables low-strain, single-phase $Er^{3+}_2O_3$ to be epitaxially grown directly on a silicon substrate.

Furthermore, the number and position of the anion vacancies can be engineered to induce a desired strain (tensile or compressive) in the dielectric layer and/or overgrown layers. For example, in some embodiments, strain in the semiconductor layer is desired in order to affect carrier mobility.

Each fluorite unit cell has two oxygen vacancies, which lie along the body diagonal as shown. The presence of these two oxygen vacancies causes the $Er^{3+}_2O_3$ unit cell to double in size, thereby doubling its lattice constant, which provides a suitable match to the lattice constant of <100> silicon.

In some alternative embodiments, oxygen vacancies lie at the ends of the face diagonal. In some other alternative embodiments, oxygen vacancies are distributed between the ends of the face diagonal and the body diagonal.

V. CONSIDERATIONS FOR PRODUCING A SINGLE-PHASE RARE-EARTH DIELECTRIC

Certain factors must be addressed to produce a composition that includes a dielectric layer comprising a single-phase rare-earth dielectric. In particular:

(1) rare-earth metals having an atomic number of 65 or less, such as cerium, promethium, or lanthanum, form cations with radii larger than 0.93 angstroms, which is unsuitable for use in embodiments of the present invention; and (2) the growth of a polar rare-earth oxide (which comprises cations and anions) on a non-polar substrate (such as silicon or germanium) tends toward multi-domain growth due to the lack of an energetically-favorable bonding site for one of either the cations or anions of the rare-earth dielectric.

A. Cation-Radius Dependency of Rare-Earth Dielectrics

Figure 6:
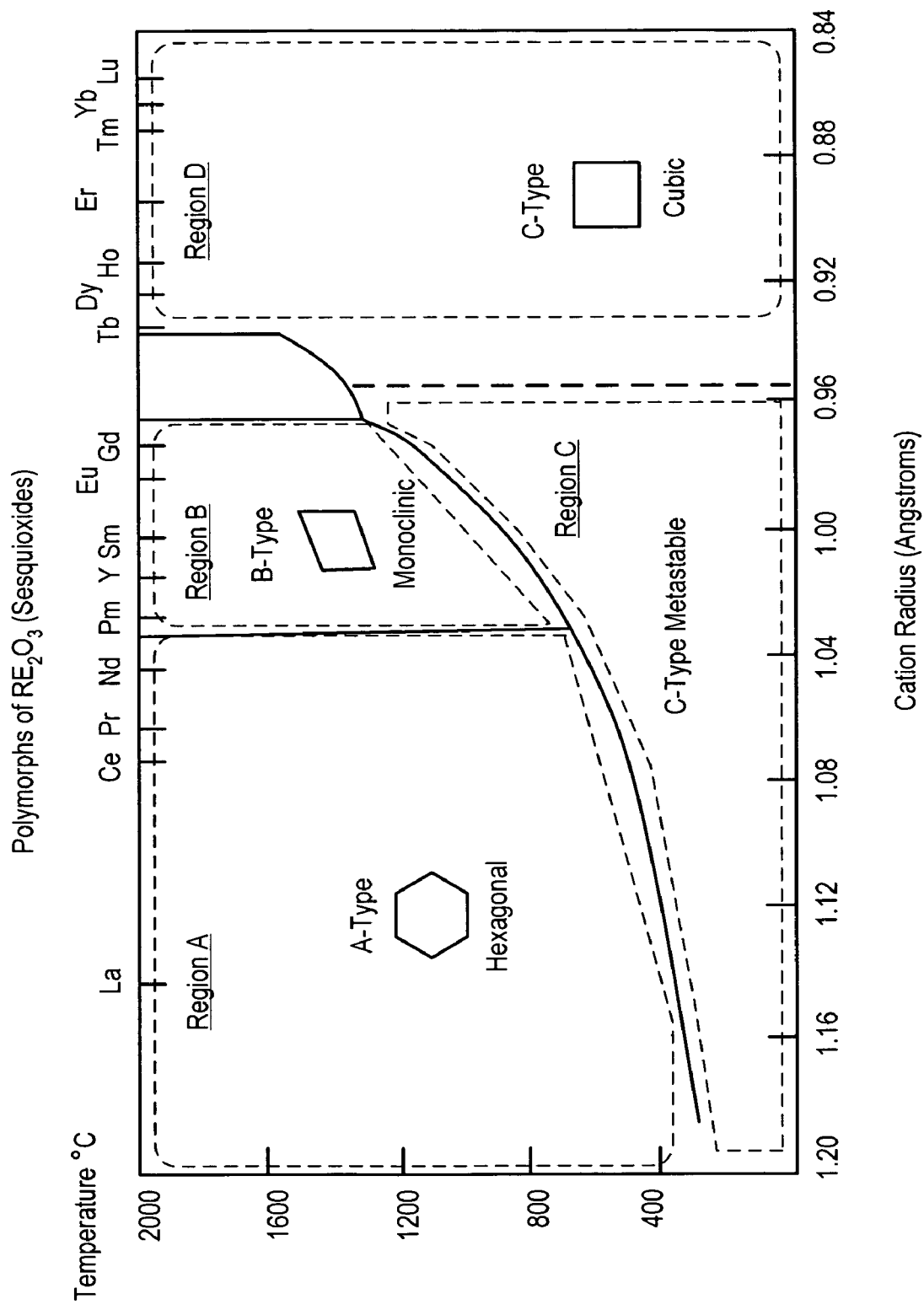
FIG. 6 depicts a chart of the polymorphs of rare-earth oxides versus temperature and as a function of cation radius.

The uniformity and stability of the crystal structure of a rare-earth oxide is dependent upon the radius of the included rare-earth cation. FIG. 6 depicts a chart of the polymorphs of rare-earth oxides versus temperature and as a function of cation radius.

Regions A through C are regions of temperature and cation radius wherein the crystal structure of the polymorphs of rare-earth oxides are unstable and are not limited to a single type over all temperatures. Therefore, rare-earth oxides formed using these rare-earth elements will exhibit polycrystalline or multi-domain crystal structure. Such oxides are undesirable for use in conjunction with the compositions that are disclosed herein.

For example, the crystal structure of a rare-earth oxide comprising lanthanum, which has a cation radius of 1.14, changes as the temperature of the crystal reduces from growth temperature to room temperature. The crystal structure of such a lanthanum-oxide will change from an A-type hexagonal structure above 400° C. to a C-type metastable structure below 400° C.

Region D is the only region wherein the rare-earth oxide polymorphs are stable over the temperature range from room temperature to 2000° C. The rare-earth oxide polymorphs that exist in region C include sesquioxides that have a cation radius less than 0.93. The rare-earth elements that have cation radii less than 0.93 include dysprosium, holmium, erbium, thulium, ytterbium, and lutetium. These rare-earth elements are also characterized by an atomic number greater than or equal to 66. These rare-earth metals, therefore, will form a stable oxygen-vacancy-derived fluorite crystal structure (i.e., bixbyite) that exhibits single-phase structure. Consequently, rare-earth metals that are suitable for use in conjunction with the illustrative embodiment include dysprosium, holmium, erbium, thulium, ytterbium, and lutetium.

B. Avoidance of Multi-Domain Growth of a Rare-Earth Dielectrics

FIG. 7A depicts the crystal structure of prior-art composition 700, which includes substrate 702 and rare-earth oxide 704.

Substrate 702 is a silicon substrate having a <100> crystal orientation. The substrate comprises a homogeneous distribution of silicon atoms 712. Silicon (and germanium) wafers have non-polar substrate surfaces since the unit cell of silicon (or germanium) crystals exhibit no polarity.

Rare-earth oxide 704 is a multi-domain, single-crystal layer that has two domains of single-crystal structure, Domain A and Domain B. These domains are each single-crystalline and have the same basic crystal structure, which is represented by unit cells 706.

Unit cell 706 comprises an arrangement of rare-earth cations 708 and oxygen anions 710, which are arranged asymmetrically. This asymmetry leads to a polarity for unit cell 706. The polarity of unit cell 706 in Domain A is opposite that of the polarity of unit cell 706 in Domain B. Since substrate 702 is a non-polar substrate, there is no energetically-favorable bonding site for either the rare-earth cations 708 or the oxygen anions 710. Therefore, crystal growth of rare-earth oxide 704 can begin in any region of the substrate with the deposition of either cations or anions. The multi-domain nature of rare-earth oxide 704 leads to a net-charge defect density that is too high for use in high-performance integrated circuits that are formed in a semiconductor layer disposed on rare-earth oxide 704. In addition, the multi-domain nature of rare-earth oxide 704 leads to undesirable surface roughness and/or structural non-uniformity.

During growth of rare-earth oxide 704, growth of the crystal structure of Domain A initiates on Locality A of substrate 702. At the same time, growth of the crystal structure of Domain B initiates on Locality B of substrate 702. Since the crystal structure initiates on the two regions of the non-polar substrate independently, and no energetically-favorable anion or cation bonding sites exist, nothing ensures that the orientation of the unit cells in Locality A and Locality B are the same. As a consequence, the polarity of unit cell 706 is oriented differently in Domain A and Domain B, and there exists an antiphase domain boundary between Domain A and Domain B. Simply put, rare-earth oxide 704 is not a single-phase material and, as such, is not suitable for use as layer 104 of composition 100A.

FIG. 7B depicts a crystal structure diagram of a specific embodiment of composition 100A (see FIG. 1, etc.). As previously described, composition 100A comprises single-phase rare-earth dielectric 104 disposed on a substrate 102.

In the embodiment that is depicted in FIG. 7B, substrate 102 is a silicon wafer having a <100> crystal orientation and a homogeneous distribution of (silicon) atoms 712. As previously disclosed, in some alternative embodiments, substrate 102 comprises a material other than <100> silicon, such as a germanium wafer having a <100> crystal orientation and a homogeneous distribution of (germanium) atoms, or a silicon or germanium wafer that has a crystal orientation other than <100>, such as <111>, etc.

In the embodiment that is depicted in FIG. 7B, single-phase dielectric 104 is a rare-earth oxide, such as a single-phase layer of $Er^{3+}_2O_3$, as represented by unit cells 714. In contrast to unit cell 706 of rare-earth oxide 704, the polarity of unit cell 714 is uniform throughout the rare-earth oxide. That is, the rare-earth oxide exhibits single domain morphology.

In the embodiment shown in FIG. 7B, monolayer 716 of oxygen anions 710 is first deposited on the surface of substrate 102, thereby forming anion-terminated surface 718. Anion-terminated surface 718 provides energetically-favorable bonding sites for rare-earth cations 708, thus ensuring uniform orientation of unit cells 714.

1. Surfaces Suitable for Growing Single-Phase Rare-Earth Dielectrics

Rare-earth dielectrics typically comprise polar crystals. In order to form single-phase rare-earth dielectrics on a non-polar substrate, such as a silicon wafer, the substrate surface must provide energetically-favorable bonding sites for one of either anions or cations. Several methods have been found to provide a substrate surface that enables epitaxial growth of single-phase rare-earth dielectrics that have bixbyite oxygen-vacancy-ordered crystal structure. These methods are listed below; structures formed by the methods are depicted in FIGS. 8A through 8D:

(i) providing an anion or cation terminated surface;
(ii) compensation of the semiconductor surface using an oxide or nitride;
(iii) preferential growth on miscut semiconductor wafers;
(iv) compensation of the semiconductor surface with material having a rock-salt crystal structure having a non-polar surface, such as the <001> surface of ytterbium-monoxide (YbO) or the <001> surface of erbium nitride; and
(v) anion ordering using a short-period superlattice.

It is notable that compositions 800A through 800D depicted in respective FIGS. 8A through 8D are consistent with composition 100A of FIG. 1. Compositions 800A through 800D simply show further details of various transitional layers, etc., that enable composition 100A.

Figure 8A:
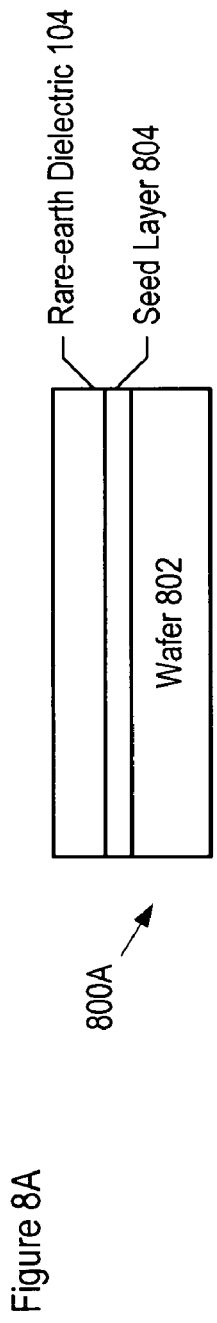
FIG. 8A depicts a layer structure comprising energetically-favorable bonding sites for rare-earth oxide anions, according to the illustrative embodiment of the present invention.

FIG. 8A depicts composition 800A in accordance with a first embodiment and based on methods (i) or (ii), above. Composition 800 comprises wafer 802, seed layer 804, and rare-earth dielectric 104. Wafer 802 and seed layer 804 collectively represent substrate 102 of composition 100A of FIG. 1. As described further below, seed layer 804 provides energetically-favorable bonding sites for rare-earth oxide anions (or cations), according to the illustrative embodiment of the present invention.

In some embodiments, wafer 802 comprises silicon having a <100> crystal orientation. Rare-earth dielectric 104 has been described earlier; in this embodiment, it is assumed to be a layer of erbium oxide having the formula $Er^{3+}_2O_3$ and a thickness of about 5 microns. Rare-earth dielectric 104 is epitaxially-deposited on seed layer 804 by atomic-layer epitaxy ("ALE").

In some embodiments, seed layer 804 provides an energetically-favorable bonding surface for cations that are present in rare-earth dielectric 104 by terminating the non-polar silicon bonds with anions (see, e.g., anion-terminated surface 718 of FIG. 7B). Thus, the combination of wafer 802 and seed layer 804 serves as the substrate (i.e., substrate 102) upon which the rare-earth dielectric 104 is grown. During ALE, the surface mobility of the rare-earth cations promotes the growth of the rare-earth dielectric in the same manner across the entire surface of the substrate, thereby forming a single-phase crystalline layer.

In some embodiments in which seed layer 804 provides an anion-terminated surface, the seed layer is one or more monolayers of oxygen atoms. The oxygen atoms terminate the semiconductor (e.g., silicon) bonds that are available at the surface of wafer 802. Seed layer 804 is epitaxially-deposited on the surface of wafer 802 by ALE.

In some embodiments that provide an anion-terminated surface, seed layer 804 is silicon dioxide, silicon nitride, or silicon oxynitride. Since silicon dioxide, silicon nitride, and silicon oxynitride are amorphous, they should be present as no more than a few monolayers. Although amorphous in thicker layers, these materials will retain an underlying crystal structure in layers of only a few monolayers. In still other alternative embodiments, seed layer 804 comprises a rare-earth nitride layer, such as erbium nitride. In yet some embodiments, seed layer 804 comprises a rare-earth phosphide.

In some embodiments, seed layer 804 provides an energetically-favorable bonding surface for anions that are present in rare-earth dielectric 104 by terminating the non-polar semiconductor (e.g., silicon, etc.) bonds with cations. During ALE, the surface mobility of the rare-earth anions promotes the growth of the rare-earth dielectric in the same manner across the entire surface of the substrate, thereby forming a single-phase crystalline layer.

In some embodiments that provides a cation-terminated surface, seed layer 804 is one or more monolayers of rare-earth cations, such as a rare-earth metal (e.g., $Er^{+3}$, etc.).

Figure 8B:
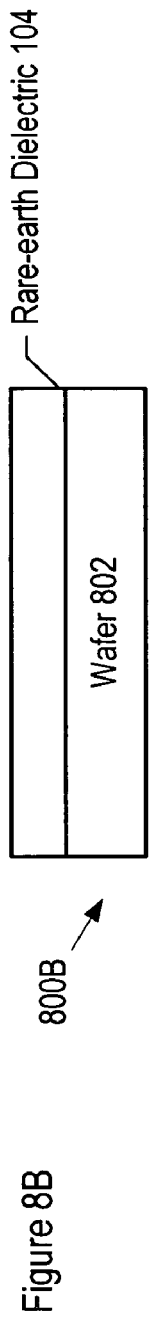
FIG. 8B depicts a layer structure comprising a miscut substrate that enables single-phase crystalline growth of a rare-earth dielectric, according to an alternative embodiment of the present invention.

FIG. 8B depicts composition 800B, which includes wafer 802 and rare-earth dielectric 104. In accordance with a second embodiment and based on method (iii) listed, wafer 802 is miscut, which enables single-phase crystalline growth of rare-earth dielectric 104 directly on the wafer without the use of a transitional layer. For composition 800B, wafer 802 is equivalent to substrate 102 of composition 100A.

In some embodiments, wafer 802 comprises a miscut <100> silicon wafer, wherein the crystalline orientation of the wafer is cut at an angle of about 6° from the <100> surface toward the <110> direction. In some other embodiments, wafer 802 is a miscut germanium wafer.

Figure 8C:
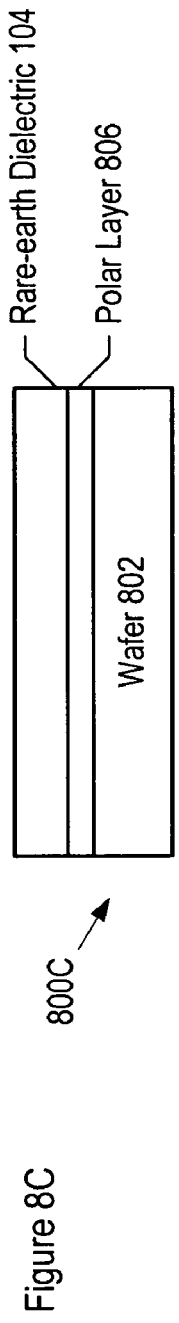
FIG. 8C depicts a layer structure comprising a layer of ytterbium monoxide (YbO) that enables single-phase crystalline growth of a bixbyite structure rare-earth dielectric, according to an alternative embodiment of the present invention.

FIG. 8C depicts composition 800C comprising wafer 802, polar layer 806, and rare-earth dielectric 104.

In some embodiments, polar layer 806 is ytterbium monoxide (YbO), which enables single-phase crystalline growth of a rare-earth dielectric. Polar layer 806, which is several monolayers thick, is deposited on non-polar wafer 802 using ALE, thereby effectively changing the character of the substrate surface from non-polar to polar. In this composition, the combination of wafer 802 and polar layer 806 serve as substrate 102 of composition 100A. In some other embodiments, polar layer 806 is erbium nitride (ErN).

YbO and ErN are different from most of the rare-earth dielectrics previously described to the extent that it forms the crystal structure of rock-salt, rather than bixbyite. The crystal structure of rock-salt is well-known to those skilled in the art. Depending upon growth conditions, a layer of YbO can form either a polar or non-polar surface. For example, the <001> surface of YbO has anions and cations in the same plane, thereby providing a non-polar surface. Therefore, YbO can be used to change the surface state of a non-polar surface to polar or, alternatively, to change the surface of a polar surface to non-polar. In addition, YbO has a lattice constant that is closely-matched to the lattice constant of silicon. Therefore, YbO provides a low-strain means of terminating the non-polar silicon surface and providing a polar surface that is favorable for epitaxial growth of a single-phase rare-earth dielectric, such as $Er^{3+}_2O_3$.

In some alternative embodiments, rare-earth dielectric 104 comprises a layer of YbO, such that rare-earth dielectric 104 is simply a continuation of polar layer 806.

Figure 8D:
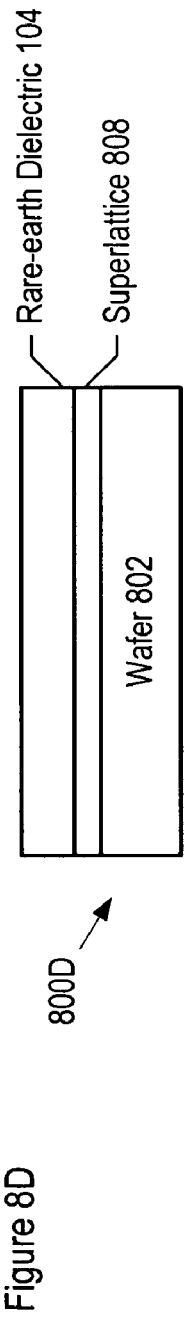
FIG. 8D depicts a layer structure comprising a superlattice of alternating layers that enables single-phase crystalline growth of a bixbyite structure rare-earth dielectric, according to an alternative embodiment of the present invention.

FIG. 8D depicts composition 800D, which includes wafer 802, super-lattice 808, and rare-earth dielectric 104. Super-lattice 808 enables the growth of a single-phase rare-earth dielectric. In composition 800D, wafer 802 and superlattice 808 represent substrate 102 of composition 100A.

In some embodiments, superlattice 808 comprises alternating layers of oxygen-rich erbium oxide and oxygen-poor erbium oxide having respective formulas $ErO_{1.5+y}$ and $ErO_{1.5+x}$, where x and y are less than one. The layer structure of the superlattice enables (i) the strain due to lattice mismatch and (ii) the anion ordering to be engineered.

In some alternative embodiments, superlattice 808 comprises another anion-rich/cation-rich superlattice structure, such as ytterbium oxide and erbium oxide. In some further embodiments, super lattice 808 comprises alternating layers of erbium oxide and erbium nitride as a means of ordering the bixbyite oxygen vacancies.

VI. ACTIVE-LAYER EPITAXY ON RARE-EARTH DIELECTRICS

In order to form semiconductor-on-insulator structure 100B that is depicted in FIG. 2, such that it is suitable for high-performance FET devices, active layer 106 must have a single-phase crystal structure. The optimal deposition surface for silicon (or germanium) epitaxy is non-polar, since silicon, germanium, and silicon-germanium are non-polar crystals. Since most rare-earth dielectrics typically comprise polar crystals, epitaxial-growth of silicon or germanium on a rare-earth dielectric has proven problematic. Stress at the interface and lattice-constant mismatch are two critical issues that must be addressed in order to achieve single-phase active layer on a rare-earth dielectric.

Several methods have been found to provide a rare-earth dielectric surface that enables epitaxial growth of single-phase non-polar semiconductors, such as silicon and germanium. Compositions that are formed using these methods are depicted in FIGS. 9A and 9B.

FIG. 9A depicts composition 900A in accordance with an embodiment of the present invention. Composition 900A comprises substrate 102, dielectric 104, interface layer 902, and active layer 106. Interface layer 902 provides a suitable surface for epitaxial growth of a non-polar semiconductor (to form active layer 106) on dielectric layer 104. It is notable that composition 900A (and composition 900B of FIG. 9B) is consistent with composition 100B of FIG. 2. Compositions 900A and 900B simply show further various transitional layers, etc., that enable composition 100B.

Substrate 102, dielectric 104, and active layer 106 have been described previously. It is understood that substrate 102 includes transitional layers, to the extent that they are present, as depicted in FIGS. 8A, 8C, and 8D.

In some embodiments, dielectric 104 is a layer of rare-earth oxide such as erbium oxide, $Er^{3+}_2O_3$ and has thickness of about 1000 nanometers. In some embodiments, active layer 106 is a layer of epitaxially-grown single-phase silicon that has a thickness of about 100 nm.

In some embodiments, interface layer 902 is a rare-earth nitride, such as erbium nitride. Erbium nitride has a rock-salt crystal structure that can have a surface character that is either polar or non-polar. Erbium nitride, therefore, can provide a change in the character of the growth surface for active layer 106 from polar (i.e., the surface character of erbium oxide) to non-polar. In some embodiments in which erbium nitride is used for interface layer 902, the thickness of that layer is less than five monolayers.

In addition to changing the character of the growth surface to enable deposition of active layer 106, rare-earth nitrides, such as erbium nitride, also provide a diffusion barrier to boron. This is important since boron can be diffused or implanted into active layer 106 to form transistors, etc. In the absence of a suitable diffusion barrier, boron that was implanted in active layer 106 can diffuse into dielectric layer 104. The presence of boron in dielectric layer 104 has deleterious effects on the performance of composition 100B when used for the fabrication of high-performance integrated circuits and devices.

In some alternative embodiments of the present invention, interface layer 902 comprises a layer of YbO. Like erbium nitride, YbO has a rock-salt crystal structure, which can provide a surface character that is either polar or non-polar. YbO, therefore, can also provide a change in the character of the growth surface for active layer 106 from polar (i.e., the surface character of erbium oxide) to non-polar. In still some other alternative embodiments of the present invention, dielectric layer 104 comprises YbO, such that interface layer 902 is a continuation of dielectric layer 104.

FIG. 9B depicts composition 900B, in accordance with an embodiment of the present invention. Composition 900B comprises substrate 102, single-phase dielectric layer 104, termination layer 904, nucleation layer 906, and active layer 106.

Termination layer 904 and nucleation layer 906 serve as an interface that provides a suitable surface for epitaxial growth of a non-polar semiconductor on a rare-earth dielectric, according to an alternative embodiment of the present invention.

In some embodiments, termination layer 904 comprises one or more monolayers of rare-earth metal, such as erbium. Termination layer 904 provides a wetting surface suitable for the subsequent growth of nucleation layer 906. In some alternative embodiments, termination layer 904 comprises a rare-earth nitride, such as erbium nitride. In some further alternative embodiments, termination layer 904 comprises an oxygen terminated surface.

In some embodiments, nucleation layer 906 comprises one or more monolayers of low-temperature-growth silicon. Nucleation layer 906 provides nucleation sites for the subsequent epitaxial growth of active layer 106.

While nucleation layer 906 is beneficial for the epitaxial deposition of silicon on termination layer 904, in some alternative embodiments of the present invention wherein active layer 106 comprises germanium, nucleation layer 906 is optional.

It is to be understood that the above-described embodiments are merely illustrative of the present invention and that many variations of the above-described embodiments can be devised by those skilled in the art without departing from the scope of the invention. For example, in this Specification, numerous specific details are provided in order to provide a thorough description and understanding of the illustrative embodiments of the present invention. Those skilled in the art will recognize, however, that the invention can be practiced without one or more of those details, or with other methods, materials, components, etc.

Furthermore, in some instances, well-known structures, materials, or operations are not shown or described in detail to avoid obscuring aspects of the illustrative embodiments. It is understood that the various embodiments shown in the Figures are illustrative, and are not necessarily drawn to scale. Reference throughout the specification to "one embodiment" or "an embodiment" or "some embodiments" means that a particular feature, structure, material, or characteristic described in connection with the embodiment(s) is included in at least one embodiment of the present invention, but not necessarily all embodiments. Consequently, the appearances of the phrase "in one embodiment," "in an embodiment," or "in some embodiments" in various places throughout the Specification are not necessarily all referring to the same embodiment. Furthermore, the particular features, structures, materials, or characteristics can be combined in any suitable manner in one or more embodiments. It is therefore intended that such variations be included within the scope of the following claims and their equivalents.

What is claimed is:

1. A composition comprising:
   a substrate;
   a first layer, wherein said first layer comprises a dielectric that comprises a rare-earth metal, and wherein said first layer has a substantially single-phase structure; and
   a second layer, wherein said second layer is interposed between said substrate and said first layer, and wherein said second layer comprises a superlattice wherein said superlattice comprises alternating layers of oxygen-rich rare-earth oxide and oxygen-poor rare-earth oxide.

2. A composition comprising:
   a substrate:
   a first layer, wherein said first layer comprises a dielectric that comprises a rare-earth metal, and wherein said first layer has a substantially single-phase structure; and
   a second layer, wherein said second layer is interposed between said substrate and said first layer, and wherein said second layer comprises a superlattice wherein said superlattice comprises alternating layers of ytterbium oxide and erbium oxide.

* * * * *